United States Patent [19]

Esman et al.

[11] Patent Number: 5,434,501

[45] Date of Patent: Jul. 18, 1995

[54] POLARIZATION INSENSITIVE CURRENT AND MAGNETIC FIELD OPTIC SENSOR

[75] Inventors: Ronald D. Esman, Burke; Alan D. Kersey, Fairfax Station, both of Va.; Michael J. Marrone, Severna Park, Md.

[73] Assignee: The United States of America as represented by the Secretary of the Navy, Washington, D.C.

[21] Appl. No.: 235,842

[22] Filed: Apr. 29, 1994

[51] Int. Cl.[6] .............................................. G01R 33/32
[52] U.S. Cl. .................................... 324/96; 324/244.1; 324/117 R; 250/227.17; 356/365
[58] Field of Search ................. 324/96, 117 R, 244.1; 250/227.17, 227.19, 227.27; 356/351, 345, 365

[56] References Cited

U.S. PATENT DOCUMENTS

| | | |
|---|---|---|
| 4,563,639 | 1/1986 | Langeac . |
| 4,733,938 | 3/1988 | Lefevre et al. . |
| 4,853,534 | 8/1989 | Dakin . |
| 4,922,095 | 5/1990 | Gergely . |
| 5,051,577 | 9/1991 | Lutz et al. . |
| 5,149,962 | 9/1992 | Maurice . |

OTHER PUBLICATIONS

Wanser et al., "Remote Polarization Control for Fiber-Optic Interferometers", Printed in Optics Ltrs., Mar. 1987, vol. 12, No. 3, pp. 217–219.

Wanser, "Polarization Fade Free Michelson Interferometer Using Ordinary Non-Birefringent Optical Fiber", Preprint from Proc. SPIE, 891 (1988), presented at O-E Lase '88 Los Angeles.

Pistoni et al., "Birefringence Effects Suppression in Optical Fiber Sensor Circuits", Proc. 7th Int. Conf. on Optical Fiber Sensors (OFS '90), p. 125, Sydney, Australia, Dec. 1990 (pub. by IREE Australia).

Okoshi, "Polarization-State Control Schemes for Heterodyne or Homodyne Optical Fiber Communications", Printed in Journal of Lightwave Technology, vol. LT-3, No. 6, Dec. 1985, pp. 1232–1236.

Morioka et al., "Ultrafast Reflective Optical Kerr Demultiplexer Using Polarisation Rotation Mirror", printed in Electronics Ltrs., 12 Mar. 1992, vol. 28, No. 6, pp. 521–522.

Martinelli, "A Universal Compensator for Polarization Changes Induced by Birefringence on a Retracing Beam", printed in Optical Communications, vol. 72, No. 6, 15 Aug. 1989, pp. 341–344.

(List continued on next page.)

Primary Examiner—Kenneth A. Wieder
Assistant Examiner—Mark A. Wardas
Attorney, Agent, or Firm—Thomas E. McDonnell; Daniel Kalish

[57] ABSTRACT

A sensor system includes a sensor head, an optical source, and a measurement apparatus. The sensor head includes a beamsplitter having first, second, third, and fourth ports, the beamsplitter being responsive to light selectively applied to the first, second and third ports for passing light of a first polarization state from the first port to the second port, for passing light of a second polarization state from the first port to the third port, for passing light of the second polarization state from the second port to the fourth port, and for passing light of the first polarization state from the third port to the fourth port. The optical source means provides light to the first port. The sensor head further includes a bidirectional polarimetric sensor responsive to polarized light output by the beamsplitter at the second and third ports and to an electromagnetic field applied to the polarimetric sensor for producing first polarized light at said third port and for producing second polarized light at said second port. The first and second polarized light have polarization states each of which varies as a function of the electromagnetic field and the polarization state of the light output by the beamsplitter at the other one of the second and third ports. The measurement means is responsive to light from the fourth port for producing an output signal indicative of the electromagnetic field strength.

17 Claims, 3 Drawing Sheets

OTHER PUBLICATIONS

Marrone et al., "Polarization Independent Current Sensor Using an Orthoconjugating Fiber Loop Mirror", Conference on Optical Fiber Sensors (OFS '91), Florence, Italy, May 4–6, 1993.

Kersey et al., "Polarisation–Insenstive Fibre Optic Michelson Interferometer", reprinted from Electronics Ltrs., 14 Mar. 1991, vol. 27, No. 6, pp. 518–519.

Day et al., "Faraday Effect Sensors: The State of the Art", printed in SPIE, vol. 985, Fiber Optic and Laser Sensors VI, (1988), pp. 138–150.

Esman et al., "Technique to Eliminate Polarization Sensitivity in Fiber–Optic Transducers", Conference on Lasers and Electro–Optics, May 2–7, 1993, Baltimore, Md., 1993 Technical Digest Series, vol. 11.

Chang et al., "Polarisation–Indepedent Lightwave Switch/Modulator at 820 and 1300 nm for Fibre–Optic Systems", printed in Electronics Ltrs., 19 Jan. 1989, vol. 25, No. 2.

Laming et al., "Electric Current Sensors Employing Spun Highly Birefringent Optical Fibers", printed in Journal of Lightwave Tech., vol. 7, No. 12, Dec. 1989, pp. 2084–2094.

Marrone et al., "Fiber–Optic Magnetic Field Sensor with an Orthoconjugating Loop Mirror", reprint from Optics Ltrs., vol. 18, No. 18, Sep. 15, 1993, pp. 1556–1558.

Pistoni et al., "Vibration–Insensitive Fiber–Optic Current Sensor", printed in Optics Ltrs., vol. 18, No. 4, Feb. 15, 1993, pp. 314–316.

POLARIZATION INSENSITIVE CURRENT AND MAGNETIC FIELD OPTIC SENSOR

CROSS REFERENCE TO RELATED PATENTS AND APPLICATIONS

This application is related to commonly assigned and co-pending U.S. application Ser. No. 08/068,470 filed May 3, 1993 by the inventors Ronald Esman, Irl N. Duling III, and Alan D. Kersey and having docket no. NC 75,153. U.S. application Ser. No. 08/068,470 is incorporated herein by reference.

FIELD OF THE INVENTION

The present invention relates to optic sensors and particularly to polarimetric sensor systems for measuring currents or magnetic fields.

DESCRIPTION OF THE RELATED ART

In polarimetric sensing systems, a sensing element modifies the polarization state of an optical signal in response to a measurand field. For example, a Faraday rotator sensor produces a nonreciprocal polarization state rotation in the presence of a magnetic field. The extent of the polarization state rotation is proportional to the magnetic field component strength along the direction of optical propagation. Such a Faraday rotator sensor could be used as a magnetometer or, by use of a coil and application of Ampere's law, as an electric current sensor.

Fiber birefringence is an important technical impediment to practical application of polarimetric sensors. Except for expensive polarization-maintaining fibers, optical fibers typically modify the state of polarization of light passing through them because of physical irregularity in the fiber, thermal or mechanical stress, or other environmental factors. Polarimetric sensors are extremely sensitive to the polarization of the applied light. They perform optimally in response to interrogatory optical signals having a preferred and stable polarization state.

For remote sensing, the light source and the measurement apparatus are typically linked to the sensor head by optical fiber. Unless expensive polarization-maintaining fiber is used, the polarization state of the interrogating light will evolve in an unpredictable and erratic manner and will arrive at the sensor head having an arbitrary, indeterminate, and unstable polarization state. Since the input light is generally not in the preferred polarization state, the polarimetric sensor does not perform optimally. Since the input polarization state is not stable, the resulting output of the sensor head will fluctuate unpredictably independent of the measurand field, thereby masking any influence of the measurand field. Furthermore, the polarization state of light output from the sensor head will evolve unpredictably as it is transmitted to the measurement apparatus, thus making analysis and interpretation very difficult.

Various active and passive schemes have been proposed to control and stabilize the polarization state of light transmitted by an optical fiber. In the active schemes, a feedback loop compensates the output polarization state. However, when applied to remote polarization sensors, such active schemes have the drawbacks of insertion loss, ineffective response time, and additional cost. The passive schemes typically do not have optimal performance for arbitrary input polarization state. For example, Martinelli, M., "A Universal Compensator for Polarization Changes Induced by Birefringence on a Retracing Beam," Optics Communications, Vol 72, No. 6 (1989) and Pistoni, N. C. and Martinelli, M., "Vibration-Insensitive Fiber-Optic Current Sensor," Optics Letters, Vol. 18, No. 4 (1993) purport to overcome polarization problems due to fiber birefringence. However, neither article proposes a passive scheme which is effective for circularly polarized light input to a sensor head.

SUMMARY OF THE INVENTION

It is an object of this invention to provide a fiber optic polarimetric sensor system which utilizes a light source having arbitrary polarization state.

It is a further object of the invention to provide a fiber optic polarimetric sensor system which utilizes a light source having arbitrary polarization state and uses a passive technique to provide polarized light to the sensing element.

Another object of the invention is to provide a fiber optic polarimetric sensor system having a sensor head remote from a light source and from a measurement apparatus in which non-polarization-maintaining fiber is used for transmission between the light source and the sensor head, and between the sensor head and the measurement apparatus.

A still further object of the invention is to provide a fiber optic polarimetric sensor system having a sensor head remote from a light source and from a measurement apparatus, in which (1) a non-polarization-maintaining fiber is used for transmission from the light source to the sensor head, (2) another non-polarization-maintaining fiber is used for transmission from the sensor head to the measurement apparatus, and (3) which uses a passive technique to provide polarized light to the sensing element.

Another object of the invention is to provide a fiber optic polarimetric sensor system having a sensor head remote from a light source and from a measurement apparatus, in which (1) a non-polarization-maintaining fiber is used for transmission from the light source to the sensor head, (2) the same fiber is used for transmission from the sensor head to the measurement apparatus, and (3) which uses a passive technique to provide polarized light to the sensing element.

These and other objectives are achieved by a sensor system which includes a sensor head, an optical source, and a measurement apparatus. The sensor head includes a beamsplitter having first, second, third, and fourth ports, the beamsplitter being responsive to light selectively applied to the first, second and third ports for passing light of a first polarization state from the first port to the second port, for passing light of a second polarization state from the first port to the third port, for passing light of the second polarization state from the second port to the fourth port, and for passing light of the first polarization state from the third port to the fourth port. The optical source means provides light to the first port. The sensor head further includes a bidirectional polarimetric sensor responsive to polarized light output by the beamsplitter at the second and third ports and to an electromagnetic field applied to the polarimetric sensor for producing first polarized light at said third port and for producing second polarized light at said second port. The first and second polarized light have polarization states each of which varies as a function of the electromagnetic field and the polarization state of the light output by the beamsplitter at the other one of the second and third ports. The measurement means is responsive to light from the fourth port for producing an output signal indicative of the electromagnetic field strength.

Alternatively, the beamsplitter may be responsive to light selectively applied to the first, second and third ports for passing light of a first polarization state from the first port to the second port, for passing light of a second polarization state from the first port to the third port, for passing light of the first polarization state from the second port to the first port, and for passing light of the second polarization state from the third port to the first port. The bidirectional polarimetric sensor rotates light by a rotation angle biased at 45°. The sensor head outputs light with polarization state orthoconjugate to the input state. The sensor system further includes a coupler and an optical fiber for transmitting light between the coupler and the sensor head. This optical fiber is used for both input and output. The coupler transmits light from a source to the optical fiber. Light output by the sensor head is transmitted through the optical fiber and returns to the coupler with polarization state orthogonal to the polarization state of the input light which left the coupler. The coupler splits off output light for detection and analysis.

This polarimetric sensor system utilizes a light source having arbitrary polarization state. It uses a passive technique to provide polarized light to the sensing element. It is suitable for use as fiber optic polarimetric sensor system having a sensor head remote from a light source and from a measurement apparatus in which non-polarization-maintaining fiber is used for transmission between the light source and the sensor head, and between the sensor head and the measurement apparatus.

These and other objects, features and advantages of the present invention are described in or apparent from the following detailed description of preferred embodiments.

BRIEF DESCRIPTION OF THE DRAWINGS

The preferred embodiments will be described with reference to the drawings, in which like elements have been denoted throughout by like reference numerals, and wherein.

DETAILED DESCRIPTION OF THE PREFERRED EMBODIMENTS

Figure 1:
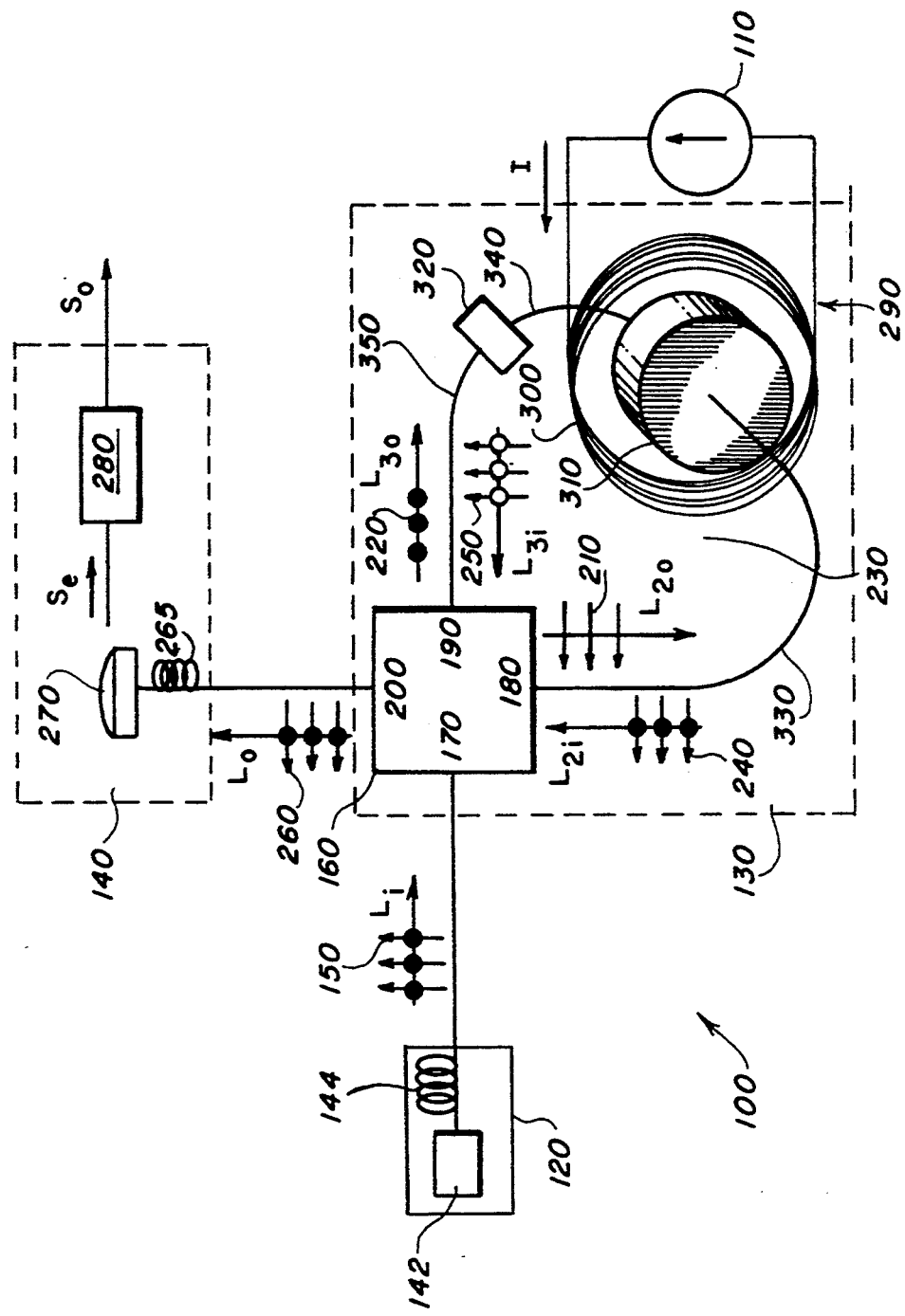
FIG. 1 shows a polarimetric sensor system according to the present invention.

Referring now to the drawings, FIG. 1 shows a polarimetric sensor system 100 for measuring electric current I provided by a current source 110. The present invention could equally well be applied to measure the strength of a magnetic field F (not shown). The field being measured will be referred to generically herein as the electromagnetic field F.

An optical source 120 provides light $L_i$ to a sensor head 130. As described further below, the sensor head 130 produces output light $L_o$ indicative of the current I, or in general, the electromagnetic field F. An output system 140 responsive to the output light $L_o$ produces an output signal $S_o$ indicative of the current I, or in general, the electromagnetic field F.

The optical source 120 may include a laser 142 and a non-polarization-maintaining optical fiber 144, such as a single mode fiber, so that the sensor head 130 and the laser are remote from each other. The laser 142 could be, for example, laser diode model #0L354A-20 from Oki Electric Industry Co., Inc., Tokyo, Japan with U.S. Distributor Mas-Tech International, Inc. in Randolph, N.J. The single mode fiber 144 could be, for example, singlemode optical fiber part #SMF-28 from Corning, Inc., Corning, N.Y.

An important feature of this sensor system 100 is that the input light $L_i$ need not have any particular state of polarization as it reaches the sensor head 130. For example, the input light $L_i$ could be circularly polarized. The polarization state 150 of the input light $L_i$ as it reaches the sensor head 130 shown at any particular instant may be arbitrary. It can vary unpredictably over time. The sensor system 100 is insensitive to the input polarization state 150.

The sensor head 130 includes a beamsplitter 160 which has first, second, third and fourth ports 170, 180, 190 and 200, respectively. The beamsplitter 160 is responsive to light selectively applied to the first, second, and third ports 170, 180, and 190, respectively, as follows.

The input light $L_i$ is applied to the first port 170 by the source 120. The beamsplitter 160 passes that component of the input light $L_i$ applied to the first port 170 having a first polarization state, for example, vertical linear polarization, to the second port 180. The beamsplitter 160 passes that component of the input light $L_i$ applied to the first port 170 having a second polarization state, for example, horizontal linear polarization, to the third port 190. The first and second states are orthogonal but otherwise arbitrary.

The light $L_{2o}$ which the beamsplitter 160 passes from the first port 170 to the second port 180 has polarization state 210, and the light $L_{3o}$ which the beamsplitter 160 passes from the first port 170 to the third port 190 has polarization state 220.

As discussed further below, the sensor head 130 includes a bidirectional polarization sensor 230 for producing first polarized light $L_{3i}$ at the third port 190 and second polarized light $L_{2i}$ at the second port 180. The first and second polarized light $L_{3i}$ and $L_{2i}$, respectively, have polarization states 250 and 240, respectively, which are represented in FIG. 1. The polarization states 240 and 250 need not have components as shown since they will vary as the output from the bidirectional polarimetric sensor 230 varies.

The beamsplitter 160 passes that component of the light $L_{2i}$ applied to the second port 180 which has the second polarization state to the fourth port 200. The beamsplitter 160 also passes that component of the light $L_{3i}$ applied to the third port 190 which has the first polarization state to the fourth port 200. The light the beamsplitter 160 passes to the fourth port 200 is the output light $L_o$ and has polarization state 260. Output light $L_o$ is a combination of that component of the light $L_{2i}$ applied to the second port 180 which has the second polarization state and that component of the light $L_{3i}$ applied to the third port 190 which has the first polarization state. Its polarization state 260 is influenced by the polarization states 240 and 250 of light $L_{2i}$ and $L_{3i}$ applied to the second and third ports 180 and 190, respectively.

The beamsplitter 160 is preferably a polarization beamsplitter, such as fiber optic splitter/combiner model FOBS-22P-1111-SSPP-1300-PBS-45 from OZ Optics Ltd., Corp., Ontario, Canada. The beamsplitter 160 could also be of any type known to persons skilled in the art, such as bulk or fused fibers, so long as it has the properties set forth above.

The output system 140 may include a non-polarization-maintaining optical fiber 265, such as a single mode fiber, for transmitting the output light $L_o$ therethrough to a remote location, a photodetector 270 responsive to light from the optical fiber 265 for producing an electrical signal $S_e$, and an analyzer 280 for analyzing the electrical signal $S_e$ to produce the output signal $S_o$. An example of the photodetector 270 is PIN detector part #QDEP from Lasertron, Inc., Burlington, Mass. The output system 140 could also be coupled to other optical elements, such as optical isolators and optical modulators for later processing of the electromagnetic field F information contained in the polarization state 260.

The sensor head 130 includes a bidirectional polarimetric sensor 230 responsive to the polarized light $L_{2o}$ and $L_{3o}$ from the second and third ports 180 and 190, respectively, and to the current I, for producing first and second polarized light $L_{3i}$ and $L_{2i}$, respectively, and for applying the first and second polarized light $L_{3i}$ and $L_{2i}$, to the third and second ports 190 and 180, respectively. In particular, the polarization state 250 of the first polarized light $L_{3i}$ is functionally dependent on the polarization state 210 of light $L_{2o}$ and the current I, and the polarization state 240 of the second polarized light $L_{2i}$ is functionally dependent on the polarization state 220 of light $L_{3o}$ and the current I. The polarimetric sensor 230 is bidirectional since it utilizes the second and third ports 180 and 190, respectively, as both input and output ports.

An exemplary polarimetric sensor 230 for sensing current includes a Faraday rotator. Such a Faraday rotator rotates the polarization state in a nonreciprocal manner by rotation angle $\delta\theta_S$ proportional to the magnetic field component strength along the direction of optical propagation. A current sensor 290 includes an electric current coil 300 for passage of the electrical current therethrough, and a bulk or fiber Faraday material 310 for bidirectional passage of light therethrough in either or both directions. Because of Ampere's law, passage of varying electric current I through the coil 300 results in a varying magnetic field in the Faraday material 310, and the varying magnetic field results in rotation of the plane of polarization of the light passing therethrough. The rotation angle $\delta\theta_S$ of the plane of polarization of light passing through the Faraday material 310 is opposite for opposite propagation directions and is proportional to the current I and the Verdet constant V of the Faraday material 310, and depends on other material properties. For example, if the rotation angle $\delta\theta_S$ is 1°, then the bidirectional Faraday material 310 rotates the polarization state by $+1°$ for light propagating through in one direction and $-1°$ for light propagating through in the other direction, when viewed with reference to the direction of propagation.

The current sensor 290 is preferably designed so that the rotation angle $\delta\theta_S$ is less than $\pi$ radians (180°), and most preferably, less than 1 radian. This result may be achieved by adjusting the number of turns in the current coil 300 or by shunting part of the sensed current.

Alternate configurations of a current sensor 290 are well known to persons of ordinary skill in the art, and include a fiber optic coil for passage of light therethrough and an electrically conductive material disposed inside the fiber optic coil for passage of the electric current therethrough.

The polarimetric sensor 230 preferably biases the polarization rotation angle $\delta\theta_S$ at about 45° so that the polarization states 210 and 220 are each rotated by a rotation angle $\theta_{BP}=45°+\delta\theta_S$. This 45° bias is preferably achieved by using a 45° Faraday Rotator 320 in series with the sensor element 310. For example, the 45° Faraday Rotator 320 could be fiber Faraday rotator part #IFFR-1550-SS-P-PM from E-Tek Dynamics, San Jose, Calif. Other means for achieving this bias are by combining the 45° Faraday rotator and sensing element into a single sensing element 230, or by appropriately biasing the current I input to the sensor 230. Operation of this sensor 100 for particular applications may be optimized with bias at other angles besides 45°.

Although not absolutely required, the polarimetric sensor 230 may include polarization-maintaining fiber 330, 340 and 350 for transmitting light between the second port 180 and the sensor element 310, between the sensor element 310 and the Faraday Rotator 320, and between the Faraday Rotator 320 and the third port 190. The polarization-maintaining fiber 330, 340 and 350 could be, for example, part #SM13-P-7/125-UV-400 from Alcoa-Fujikura Ltd., Spartanburg, S.C.. If polarization-maintaining fiber 330, 340 or 350 is used, it should be aligned before connection to intervening elements, such as the Faraday material 310 and the Faraday rotator 320. Bulk polarization-maintaining optical devices could be used as alternatives to the polarization-maintaining fiber 330, 340 and 350.

The sensor head 130 as so described produces output light $L_o$ indicative of the strength of the electromagnetic field F regardless of the state of polarization 150 of the input light $L_i$.

For the preferred embodiment, in which the polarimetric sensor 230 rotates the states of polarization 210 and 220 by a rotation angle $\delta\theta_S$ biased at 45°, i.e. $\theta_{BP}=45°+\delta\theta_S$, then the output power $P_T$ of the light $L_o$ is related to the input power $P_S$ of the light $L_i$ by the equation $$P_T = \frac{\eta_{130} P_S}{2} \cdot [1 - \sin(2\delta\theta_S)], \quad (1)$$

where $\eta_{130}$ is a factor accounting for losses in the sensor head 130. If the total losses in the system 100, taking into account transmission from the laser 142 to the sensor head 130 and from the sensor head 130 to the photodetector 270, are factored in a factor $\eta_{100}$, then the output power $P_T'$ received at the photodetector 270 is related to the power $P_S'$ produced by the laser 142, by the equation:

$$P_T' = \frac{\eta_{100} P_S'}{2} \cdot [1 - \sin(2\delta\theta_S)], \quad (2)$$

where $\eta_{100}$ is a factor accounting for losses in the polarimetric sensor system 100. The actual electromagnetic field F can then be detected by using Equation (2) and measuring the power by the output system 140, once the effect of the electromagnetic field F on the rotation angle $\delta\theta_S$ is known, and by using a reference signal to take the $\eta 100$ factor into account.

The polarimetric sensor system 100 provides maximum sensitivity to the electromagnetic field F when the rotation angle $\delta\theta_S$ is biased at 45°. From Equation (2), changes in the output power $P_T'$ for small changes in the rotation angle $\delta\theta_S$ are given by:

$$\delta P_T' \approx -\eta_{100} P_S' \cdot (\delta\theta_S). \qquad (3)$$

Equation (3) shows that in this system 100, changes $\delta P_T'$ in the output power are linearly related to small changes in the rotation angle $\delta\theta_S$. Since in a Faraday rotator, such as current sensor 290, changes in the rotation angle $\delta\theta_S$ are linearly related to changes in the current I or magnetic field F, therefore changes in the output power $\delta P_T'$ are linearly related to the electromagnetic field F. If the range of changes in the rotation angle $\delta\theta_S$ is kept small, this linear relation expressed in Equation (3) continues to hold. However, as the range of changes in the rotation angle $\delta\theta_S$ gets larger, this relation becomes nonlinear and breaks down as the range exceeds $\pi$ radians (180°). For ranges larger than $\pi$ radians, the output power is not even uniquely related to the electromagnetic field F. Therefore, the range of changes in the rotation angle $\delta\theta_S$ is preferably kept below $\pi$ radians (180°), and most preferably below 1 radian.

Figure 2:
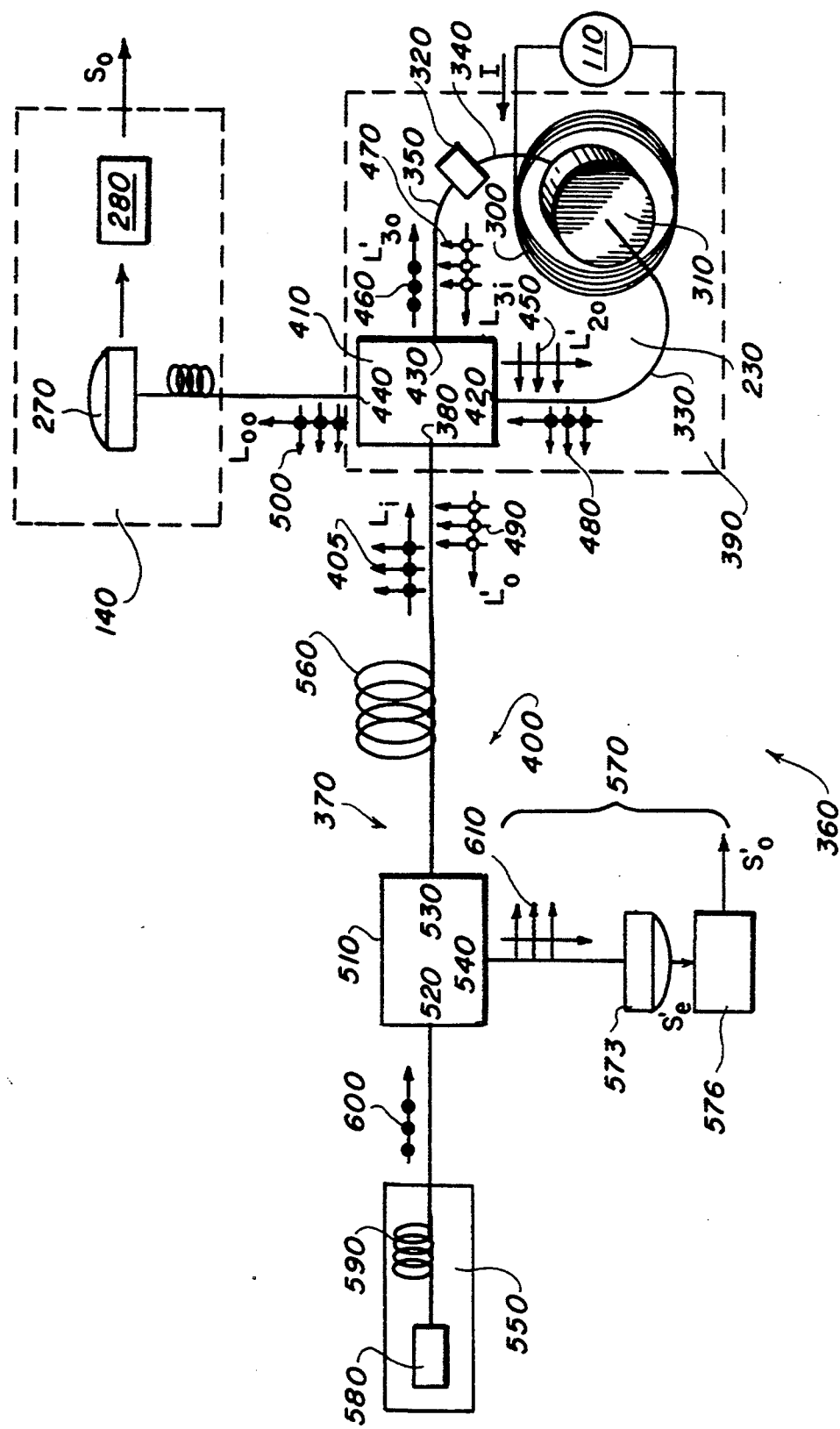
FIG. 2 shows a polarimetric sensor system according to the present invention in which the same port is used for input and output light.

Referring now to FIG. 2, a polarimetric sensor system 360 is shown for measuring electric current I provided by a current source 110. An optical source 370 provides input light $L_i'$ to a port 380 of a sensor head 390. As described further below, the sensor head 390 produces output light $L_o'$ at the first port 380, which light $L_o'$ is indicative of the current I. An output system 400 responsive to the output light $L_o'$ produces an output signal $S_o'$ indicative of the current I. In this embodiment, the same port 380 is used for both input and output light $L_i'$ and $L_o'$, respectively. As with the sensor system 100, the polarimetric sensor system 360 can also be responsive to a magnetic field F. The field being measured will be referred to generically herein as the electromagnetic field F.

The sensor head 390 includes a beamsplitter 410 which includes the first port 380 and also second and third ports 420 and 430, respectively. As an option, it may also include a fourth port 440 for outputting light $L_{oo}$.

The input light $L_i'$ need not have any particular state of polarization 405 as it reaches the sensor head 390. For example, the input light $L_i'$ could be circularly polarized. The polarization state 405 of the input light $L_i'$ as it reaches the sensor head 390 shown at any particular instant may be arbitrary. It can vary unpredictably over time. The sensor system 360 is insensitive to the input polarization state 405.

The beamsplitter 410 is responsive to light selectively applied to the port 380 (the first port 380 of the beamsplitter 410) and to second and third ports 420 and 430, respectively, as follows.

The beamsplitter 410 passes that component of the input light $L_i'$ applied to the first port 380 having a first polarization state, for example, vertical linear polarization, to the second port 420. The beamsplitter 410 passes that component of the input light $L_i'$ applied to the first port 380 having a second polarization state, for example, horizontal linear polarization, to the third port 430. The first and second states are orthogonal but otherwise arbitrary.

The light $L_{2o}'$ which the beamsplitter 410 passes from the first port 380 to the second port 420 has polarization state 450, and the light $L_{30}'$ which the beamsplitter 410 passes from the first port 380 to the third port 430 has polarization state 460.

The sensor head 390 includes a bidirectional polarization sensor 230 for producing first polarized light $L_{31}'$ at the third port 430 and second polarized light $L_{2i}'$ at the second port 420. This bidirectional polarimetric sensor 230 is discussed above (see FIG. 1). The first and second polarized light $L_{3i}'$ and $L_{2i}'$, respectively, have polarization states 470 and 480, respectively, which are represented in FIG. 2. The polarization states 470 and 480 need not have components as shown since they will vary as the output from the bidirectional polarimetric sensor 230 varies.

The beamsplitter 410 passes that component of the light $L_{2i}''$ applied to the second port 420 which has the first polarization state to the first port 380. The beamsplitter 410 also passes that component of the light $L_{3i}'$ applied to the third port 430 which has the second polarization state to the first port 380. The light the beamsplitter 410 passes to the first port 380 is the output light $L_o'$ and has polarization state 490. It is a combination of that component of the light $L_{2i}'$ applied to the second port 420 which has the first polarization state and that component of the light $L_{3i}'$ applied to the third port 430 which has the second polarization state. The output polarization state 490 is influenced by the polarization states 480 and 470 of light $L_{2i}'$ and $L_{3i}'$ applied to the second and third ports 420 and 430, respectively.

Optionally, the beamsplitter 410 passes that component of the light $L_{2i}'$ applied to the second port 420 which has the second polarization state to the fourth port 440. The beamsplitter 410 also passes that component of the light $L_{3i}'$ applied to the third port 430 which has the first polarization state to the fourth port 440. The light the beamsplitter 410 passes to the fourth port 440 is optional output light $L_{oo}$ and has polarization state 500. Optional output light $L_{oo}$ is a combination of that component of the light $L_{2i}'$ applied to the second port 420 which has the second polarization state and that component of the light $L_{3i}'$ applied to the third port 430 which has the first polarization state. The optional output polarization state 500 is influenced by the polarization states 480 and 470 of light $L_{2i}'$ and $L_{3i}'$ applied to the second and third ports 420 and 430, respectively.

The beamsplitter 410 is preferably a polarization beamsplitter, such as fiber optic splitter/combiner model FOBS-22P-1111-SSPP-1300-PBS-45 from OZ Optics Ltd., Corp. The beamsplitter 410 could also be of any type known to persons skilled in the art, such as bulk or fused fibers, so long as it has the properties set forth above.

The optional output light $L_{oo}$ produced at the fourth port 440 of the sensor system 360 could be processed just as the output light $L_o$ of the sensor system 100 is processed by the output system 140 (see FIG. 1). The above discussion regarding output light $L_o$, including Equations (1)–(3), applies equally well to sensor system 360 which produces optional output light The sensor head 390 as so described produces output light $L_o'$ indicative of the strength of the electromagnetic field F regardless of the state of polarization 450 of the input light $L_i'$.

The output power $P_R$ of the light $L_o'$ is related to the input power $P_S'$ of the light $L_i'$ by the equation $$P_R = \frac{\eta_{390} P_S'}{2} \cdot \sin^2(\theta_{BP}), \tag{4}$$

where $\eta_{390}$ is a factor accounting for losses in the sensor head and $\theta_{BP}$ is the rotation angle by which the bidirectional polarimetric sensor 230 rotates the polarization states 450 and 460 to produce light having polarization states 470 and 480, respectively.

For the preferred embodiment, in which the rotation angle $\delta\theta_S$ is biased by 45°, i.e. $\theta_{BP}=45°+\delta\theta_S$, then the output power $P_R$ of the light $L_o'$ is related to the input power $P_S'$ of the light $L_i$ by the equation $$P_R = \frac{\eta_{390} P_S'}{2} \cdot [1 + \sin(2\delta\theta_S)]. \tag{5}$$

The polarimetric sensor system 360 provides maximum sensitivity to the electromagnetic field F when the rotation angle $\delta\theta_S$ is biased at 45°. From Equation (5), changes in the output power $P_R$ for small changes in the rotation angle $\delta\theta_S$ are given by:

$$\delta P_R \approx \eta_{390} P_S' \cdot (\delta\theta_S). \tag{6}$$

Equation (6) shows that in this system 360, changes $\delta P_R$ in the output power are linearly related to small changes in the rotation angle $\delta\theta_S$. Since in a Faraday rotator, such as current sensor 290, changes in the rotation angle $\delta\theta_S$ are linearly related to changes in the current I or magnetic field F, therefore changes in the output power $\delta P_R$ are linearly related to the electromagnetic field F. If the range of changes in the rotation angle $\delta\theta_S$ is kept small, this linear relation expressed in Equation (6) continues to hold. For the same reasons as apply to system 100 (FIG. 1), the range of changes in the rotation angle $\delta\theta_S$ is preferably kept below $\pi$ radians (180°), and most preferably below 1 radian.

It is to be noted that equations (1) and (5) are very similar except for the sign of the sinusoidal term. Equation (1) specifies the optional output $L_{oo}$ at the fourth port 440. Equation (5) specifies the output $L_o'$ at the first port 380. Except for losses, all of the input light $L_i'$ applied to port 380 appears as output light $L_o'$ or optional output light $L_{oo}$. If the rotation angle $\delta\theta_S$ is biased at 45° and does not fluctuate, then the output will be split 50—50 between $L_{oo}'$ and $L_{oo}$.

Analysis of the configuration of sensor system 360 shows that because the bidirectional sensor 230 is nonreciprocal, the sensor head 390 produces an output light $L_o'$ with polarization state 490 that is orthoconjugate to the polarization state 405 of the input light $L_i'$. In other words, the polarization state 490 is orthogonal to the polarization state 405 rotated by 90° and propagates in the opposite direction. For example, if the input polarization state 405 is linear vertical, then the output polarization state 490 will be linear horizontal. If the input polarization state 405 is right circular, then the output polarization state 490 will be left circular. As shown by equations (4) and (5), the power of the return light $L_o'$ is dependent on the rotation angles $\theta_{BP}$ and $\delta\theta_S$.

The sensor system 360 preferably includes a coupler 510. The coupler 510 has first, second and third ports 520, 530 and 540, respectively. The first and second ports 520 and 530, respectively, are for input, and the second and third ports 530 and 540, respectively, are for output. Specifically, the coupler 510 passes light selectively applied to the first port 520 to the second port 530, and passes light selectively applied to the second port to the third port 530. An example of the coupler 510 is fiber optic splitter/combiner model #FOBS-12p-111-SPP-1300-PBS-45 from OZ Optics, Ltd., Corp.

The sensor system 360 preferably also includes an optical source 550 for providing light to the first port 520, an optical fiber 560 for transmitting light in both directions between the second port 530 of the coupler 510 and the first port 380, and an output system 570 responsive to light from the third port 540 for producing the output signal $S_o'$ indicative of the strength of the electromagnetic field F. The output system 570 preferably includes a photodetector 573 responsive to light from the third port 540 for producing an electrical signal $S_e'$ and an analyzer 576 for analyzing the electrical signal $S_e'$ to produce the output signal $S_o'$. An example of the photodetector 573 is PIN detector part #QDEP from Lasertron, Inc. The output system 570 could also be coupled to other optical elements, such as optical isolators and optical modulators for later processing of the electromagnetic field F information contained in the polarization state 490 and the polarization state 610 output from the third coupler port 540.

In such a sensor system 360, the optical source 370 and the output system 400 share the same optical fiber 560 for input and output. When the sensor head 390 is remote from the source 550 and output system 570, using only one optical fiber 560 for input and output is advantageous. The optical fiber 560 can be a non-polarization-maintaining fiber.

Because the polarization state 490 of the output light $L_o'$ is orthoconjugate to the polarization state 405 of the input light $L_i'$, and since conventional optical fibers exhibit reciprocal birefringence, output light $L_o'$ arrives at the second port 530 with polarization state orthogonal to the polarization state the input light $L_i'$ had when it left the second port 530. Spatial evolution along the optical fiber 560 of the polarization state of the output light $L_o'$ is exactly the opposite of the spatial evolution for the input light $L_i'$.

In the most preferred embodiment, the coupler 510 is a polarization beamsplitter and the source 550 includes a laser 580 and a polarization-maintaining fiber 590. An example of such a source 550 is laser diode model #OL354A-20PMF from Oki Electric Industry Co., Inc. The polarization state 600 of the light output from the source 550 is oriented, for example, horizontally, so that upon application to the polarization beamsplitter 510, it is passed to the second port 530 and so only that component of the light applied to the second port 530 having polarization state, for example, vertical, which is orthogonal to the polarization state 600 of the light applied to the first port 520 is passed to the third port 540. Since the output light $L_o'$ arriving at the second port 530 is orthogonal to the light the polarization beamsplitter 510 passes to the second port 530, all of the sensor head output light $L_o'$ is passed from the second port 530 to the third port 540 and on to the output system 570. For fluctuating rotation angle $\delta\theta_S$ biased at 45°, this sensor system 360 provides high sensitivity with minimal loss of optical power.

EXAMPLES

Having described the invention in general, the following examples are given as particular embodiments thereof and to demonstrate the practice and advantages thereof. It is understood the example is given by way of illustration and is not intended to limit the specification or the claims to follow in any manner.

Example 1: In a prototype demonstration of this system 360, input light $L_i'$ of 1.3 micrometer (μm) wavelength is provided by a laser 580. Beamsplitter 410 and coupler 510 are each polarization beamsplitters, connected as shown in FIG. 2. A non-polarization-maintaining fiber 560 transmits light between beamsplitters 410 and 510. The output ports 420 and 430 of the beamsplitter 410 are spliced to fiber coupled gradient-index, i.e. "GRIN" lenses. The single mode fibers of the GRIN lenses are wrapped on fiber-loop polarization controllers. Before inserting the current sensing element 310 and 45° Faraday rotator 320, the polarization controllers are adjusted to yield a linear state of polarization at the GRIN lenses and a minimum output at the third coupler port 540.

The sensing element 310 is a terbium gallium garnet (TGG) rod, 19 millimeter (mm) in length, from a tunable Faraday rotator (Optics for Research, Caldwell, N.J.). The Verdet constant for TGG at 1.3 μm light is 0.08 minute/(centimeter-Gauss) (min/(cm-Gauss)). A solenoid coil 300 produced a field of approximately 150 Gauss/Ampere (Gauss/Amp). Current source 110 produced current I at 100 Hertz (Hz) and the return signal was monitored at the third coupler port 540 by use of a photodetector 573 and analyzer circuit 576 to produce an output signal $S_o'$.

Figure 3:
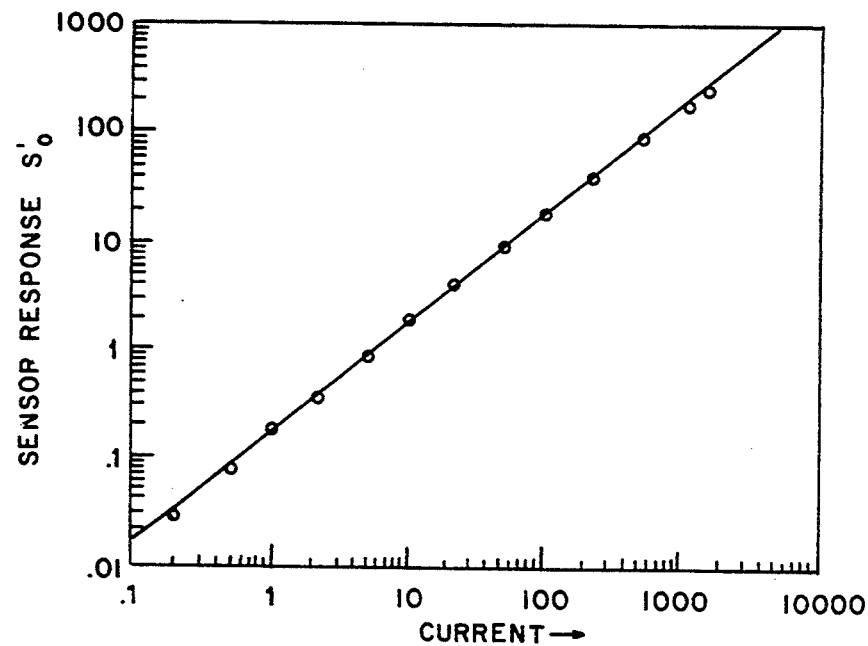
FIG. 3 shows the response in normalized linear units to applied current in units of milliamps (mA) of a prototype of the polarimetric sensor system of FIG. 2.

Referring now to FIG. 3, the response $S_o'$ of this described sensor system 360 to current I in mA is shown. The response $S_o'$ of this prototype system is linear over 4 decades of current from about 0.1 mA to about 2A. With a current I of 1 Amp in the coil, the Faraday rotation angle $\delta\theta_S$ was estimated to be 7 milliradians (mrad). Thus the minimum detectable current I of about 0.1 mA in this system corresponds to rotation sensitivity of 0.7 microradians (μrad). The corresponding minimum detectable magnetic field F is 15 milliGauss (mG). This range could readily be extended to microGauss levels, for example, by using a Faraday rotator material 310 with a Verdet constant several orders of magnitude greater than the TGG rod used in this prototype sensor 360.

Figure 4A:
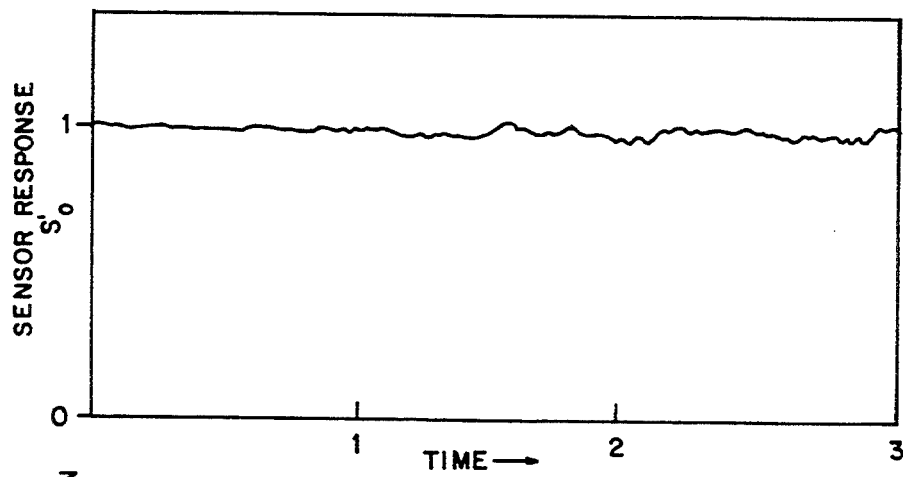
FIG. 4(a) shows the response in normalized linear units over time in minutes to constant applied current as the input polarization state is varied of a prototype of the polarimetric sensor system of FIG. 2.
Figure 4B:
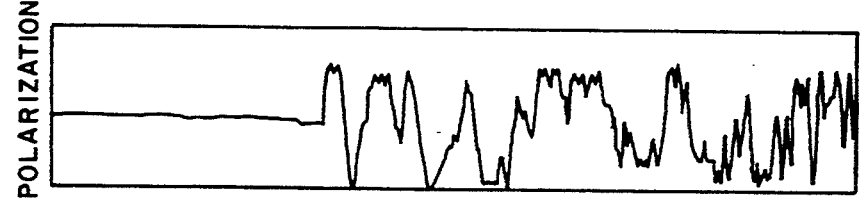
FIG. 4(b) shows the variation of the input polarization state over time in minutes corresponding to FIG. 4(a) of a prototype of the polarimetric sensor system of FIG. 2.

In order to examine the dependence or independence of the system 360 on the input polarization state 405, a fiber loop polarization controller (not shown) was inserted on the fiber 560 between beamsplitters 410 and 510. The variation of the polarization state 405 entering beamsplitter 510 was monitored by diverting a fraction of the light $L_i'$ to the beamsplitter 510 to a detector (not shown) through a prism polarizer (not shown). Referring now to FIG. 4(a), the sensor response $S_o'$ over a period of 3 minutes for a constant current I of 0.5 Amp is shown. Referring now to FIG. 4(b), the polarization state 405 entering beamsplitter 510 is shown for the same 3 minutes. For the first minute, the input polarization state 405 was constant while for the second and third minute, the input polarization state 405 was varied by manual operation of the polarization controller. The maximum and minimum values in FIG. 4(b) correspond to linear polarization states 405 parallel and perpendicular to the analyzer, and the intermediate values represent arbitrary elliptical polarization states 405. The results demonstrate that the system 360 sensitivity to input polarization state 405 is less than ±2%.

Example. 2: In another demonstration of this system 360, a polarimetric sensor system is implemented as in Example 1 except where specified otherwise. This example is used to measure current I and magnetic field F.

A single mode fiber 560 transmits light between beamsplitters 410 and 510. A pair of GRIN lenses are pigtailed to single mode fiber leads, which were wrapped on fiber-loop polarization controllers (PC) and spliced to the polarization-maintaining-fibers 330 and 350. A singlemode fiber with GRIN lens is available as SELFOC Fiber Collimator part #FCC-0AF-LBR-130-155 from NSG America, Somerset, N.J. Before inserting the current sensing element 310 and 45° Faraday rotator 320 in the gap between the GRIN lenses, the polarization controllers are adjusted to yield orthogonal linear polarization states in the gap for the two circulating beams in the loop by monitoring the output of each GRIN lens through a polarizer. Elimination of this step could be achieved with the GRIN lenses coupled directly to the polarization-maintaining-fibers 330 and 350.

The Faraday rotator 320 is a Bismuth Iron Garnet (BIG) film combined with a magnet for 45° rotation at 1.3 μm obtained from Optics for Research, Inc. The saturation field of the BIG film is 320 Gauss. The sensing element 310 is a BIG film of 0.35-mm thickness mounted on a solenoid 300, thereby producing a magnetic field of 150 Gauss/Amp. The BIG film was obtained from Optics for Research.

The results of this example are similar to those shown in FIGS. 3 except that the response of the sensor 360 in this example is linear over 5 decades of magnetism from about 1 mG to 100 Gauss. This example demonstrates polarization rotation $\delta\theta_S$ of 6.8° for a field F of 15 Gauss, yielding a linear sensitivity of about 0.45°/Gauss. A signal to noise ratio of about 40 decibels (dB) was obtained in a bandwidth of 0.3 Hz for a field of 0.1 Gauss, giving a minimum detectable field of 1 mG/$\sqrt{Hz}$.

Dependence or independence of the system 360 on the input polarization state 405, was examined as in Example 1 for a constant field of 75 Gauss, and yielded similar results. The results demonstrate that in Example 2, the system 360 sensitivity to input polarization state 405 is less than ±3%.

It is understood that many other changes and additional modifications of the invention are possible in view of the teachings herein without departing from the scope of the invention as defined in the appended claims.

What is claimed is:

1. A sensor system comprising:
   (a) a beamsplitter having first, second, and third ports, said beamsplitter being responsive to light selectively applied to said first, second and third ports for passing light of a first input polarization state from said first port to said second port, for passing light of a second input polarization state orthogonal to the first input polarization state from said first port to said third port, and for collectively passing light of a first output polarization state from said second port and of a second output polarization state orthogonal to the first output polarization state from said third port to said first port;

(b) optical source means coupled to said beamsplitter for providing light to said first port;

(c) a bidirectional polarimetric sensor responsive to polarized light output by said beamsplitter at said second and third ports and to an electromagnetic field applied to said polarimetric sensor for producing first polarized light at said third port and for producing second polarized light at said second port, the first and second polarized light having polarization states that vary as a function of the electromagnetic field and the polarization state of the light output by said beamsplitter at the other one of said second and third ports;

(d) means responsive to light from said first port for producing an output signal indicative of the electromagnetic field strength.

2. The sensor system of claim 1 wherein the beamsplitter of paragraph (a) comprises means for collectively passing light of the first input polarization state from said second port, and light of the second input polarization state from said third port to said first port.

3. The sensor system of claim 2 further comprising:

a coupler having first, second, and third coupler ports, said coupler being responsive to light selectively applied to said first and second coupler ports for passing light applied to said first coupler port to light at said second coupler port, and for passing light applied to said second port to light at said third port;

optical source means for providing light to said first coupler port;

an optical fiber for transmitting light in both directions between said second coupler port and said first port; and means responsive to light from said third coupler port for producing the output signal.

4. The sensor system of claim 2 wherein said beamsplitter (a) comprises a polarization beamsplitter.

5. The sensor system of claim 2 wherein said polarimetric sensor (c) comprises a bidirectional polarimetric sensor device having first and second sensor ports, a first polarization-maintaining optical fiber for transmitting polarized light from said second port to said first sensor port and for transmitting polarized light from said first sensor port to said second port, and a second polarization-maintaining optical fiber for transmitting polarized light from said third port to said second sensor port and for transmitting polarized light from said second sensor port to said third port.

6. The sensor system of claim 2 wherein said polarimetric sensor (c) comprises means for rotating the plane of polarization of the light output by said beamsplitter at said second port by a rotation angle to produce the first polarized light, and for rotating the plane of polarization of the light output by said beamsplitter at said third port by the rotation angle to produce the second polarized light.

7. The sensor system of claim 6 wherein the rotation angle is biased at a bias angle.

8. The sensor system of claim 7 wherein the rotation angle is biased at about 45°.

9. The sensor system of claim 2 wherein said polarimetric sensor (c) comprises a nonreciprocal rotator.

10. The sensor system of claim 9 wherein said polarimetric sensor (c) comprises a Faraday rotator.

11. The sensor system of claim 9 wherein said polarimetric sensor (c) comprises a coil responsive to variations in electric current.

12. The sensor system of claim 3 wherein said coupler comprises a polarization beamsplitter.

13. The sensor system of claim 3 wherein said optical source means comprises means for providing polarized light to said first coupler port.

14. The sensor system of claim 13 further comprising:

a laser for generating polarized light; and a polarization-maintaining fiber coupled between said laser and said coupler for transmitting the light generated by said laser to said first coupler port.

15. The sensor system of claim 3 wherein said optical fiber for transmitting light between said second coupler port and said first port comprises a non-polarization-maintaining fiber.

16. The sensor system of claim 3 wherein said means for producing an output signal comprises:

a non-polarization-maintaining optical fiber for transmitting light therethrough from said second coupler port;

a photodetector responsive to light from said non-polarization-maintaining optical fiber for producing an electrical signal; and analysis means responsive to the electrical signal for producing the output signal.

17. The sensor system of claim 2 further comprising:

a fourth port of said beamsplitter;

means responsive to light selectively applied to said second and third ports for collectively passing light of the second output polarization state from said second port and of the first output polarization state from said third port to said fourth port; and means responsive to light from said fourth port for producing an additional output signal indicative of the electromagnetic field strength.

* * * * *